(12) United States Patent
Nakayama

(10) Patent No.: US 10,714,699 B2
(45) Date of Patent: Jul. 14, 2020

(54) DETECTING ELEMENT AND DETECTOR

(71) Applicant: KABUSHIKI KAISHA TOSHIBA, Minato-ku (JP)

(72) Inventor: Kohei Nakayama, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/296,619

(22) Filed: Mar. 8, 2019

(65) Prior Publication Data

US 2020/0091452 A1    Mar. 19, 2020

(30) Foreign Application Priority Data

Sep. 13, 2018  (JP) .................................. 2018-171663

(51) Int. Cl.
*H01L 51/44*       (2006.01)
*H01L 51/42*       (2006.01)

(52) U.S. Cl.
CPC .......... *H01L 51/441* (2013.01); *H01L 51/428* (2013.01)

(58) Field of Classification Search
CPC ............................ H01L 51/441; H01L 51/428
USPC .......................................................... 257/40
See application file for complete search history.

(56) References Cited

U.S. PATENT DOCUMENTS

| | | | |
|---|---|---|---|
| 10,566,601 B2* | 2/2020 | Moriwaki | ............. H01L 31/095 |
| 2019/0145751 A1 | 5/2019 | Qi | |
| 2019/0265370 A1 | 8/2019 | Nakayama et al. | |

FOREIGN PATENT DOCUMENTS

| | | |
|---|---|---|
| JP | 2012-15434 | 1/2012 |
| JP | 2013-89685 | 5/2013 |
| JP | 2014-529728 | 11/2014 |
| JP | 2019-145751 A | 8/2019 |

OTHER PUBLICATIONS

Goldan, A., et al. "Unipolar time-differential pulse response with a solid-state Charpak photoconductor", Applied Physics Letters 101, 213503, 2012, 6 pages.

* cited by examiner

*Primary Examiner* — Tu-Tu V Ho
(74) *Attorney, Agent, or Firm* — Oblon, McClelland, Maier & Neustadt, L.L.P.

(57) ABSTRACT

According to an embodiment, a detecting element includes a first electrode, a second electrode, an organic conversion layer, a third electrode. The first electrode and the third electrode are configured to keep different potentials by DC power supply. The organic conversion layer is disposed in between the first electrode and the second electrode, and is configured to convert energy of radiation into electrical charge. The third electrode is disposed at least either in the organic conversion layer, or in between the organic conversion layer and the first electrode, or in between the organic conversion layer and the second electrode, and is at least partially covered by an insulating film.

15 Claims, 9 Drawing Sheets

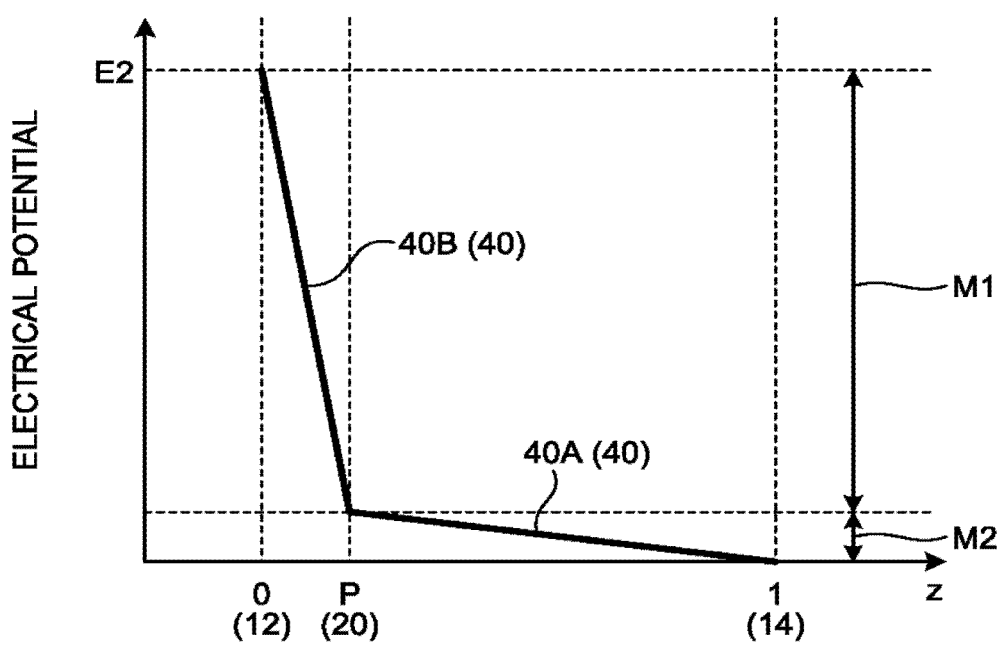

DETECTING ELEMENT AND DETECTOR

CROSS-REFERENCE TO RELATED APPLICATIONS

This application is based upon and claims the benefit of priority from Japanese Patent Application No. 2018-171663, filed on Sep. 13, 2018; the entire contents of which are incorporated herein by reference.

FIELD

Embodiments described herein relate generally to a detecting element and a detector.

BACKGROUND

There is a detecting element with an organic semiconductor layer which converts radiations into electrical charges. The detecting element outputs a current signal and the magnitude of the current signal is proportional to the number of the electron-hole pairs generated by a radiation incident on the organic conversion layer. In order to deposit the energy of the radiation efficiently, the thick conversion layer is generally suitable.

However, as the conversion layer becomes thicker, the difference in the contribution of holes and electrons to the output signal becomes larger because electrons move to an electrode longer than holes in the conversion layer. As a result, the output signals not only become dependent on the number of electron-hole pairs but also become positionally-dependent on the positions of generation of electron-hole pairs in the organic semiconductor layer. For that reason, in the conventional technology, there are times when the sensitivity for detection undergoes a decline.

BRIEF DESCRIPTION OF THE DRAWINGS

FIG. 2 is a diagram illustrating an example of the electrical potential of a detecting element.

DETAILED DESCRIPTION

According to an embodiment, a detecting element includes a first electrode, a second electrode, an organic conversion layer, a third electrode. The first electrode and the third electrode are configured to keep different potentials by DC power supply. The organic conversion layer is disposed in between the first electrode and the second electrode, and is configured to convert energy of radiation into electrical charge. The third electrode is disposed at least either in the organic conversion layer, or in between the organic conversion layer and the first electrode, or in between the organic conversion layer and the second electrode, and is at least partially covered by an insulating film.

Exemplary embodiments of the invention are described below in detail with reference to the accompanying drawings.

First Embodiment

Figure 1A:
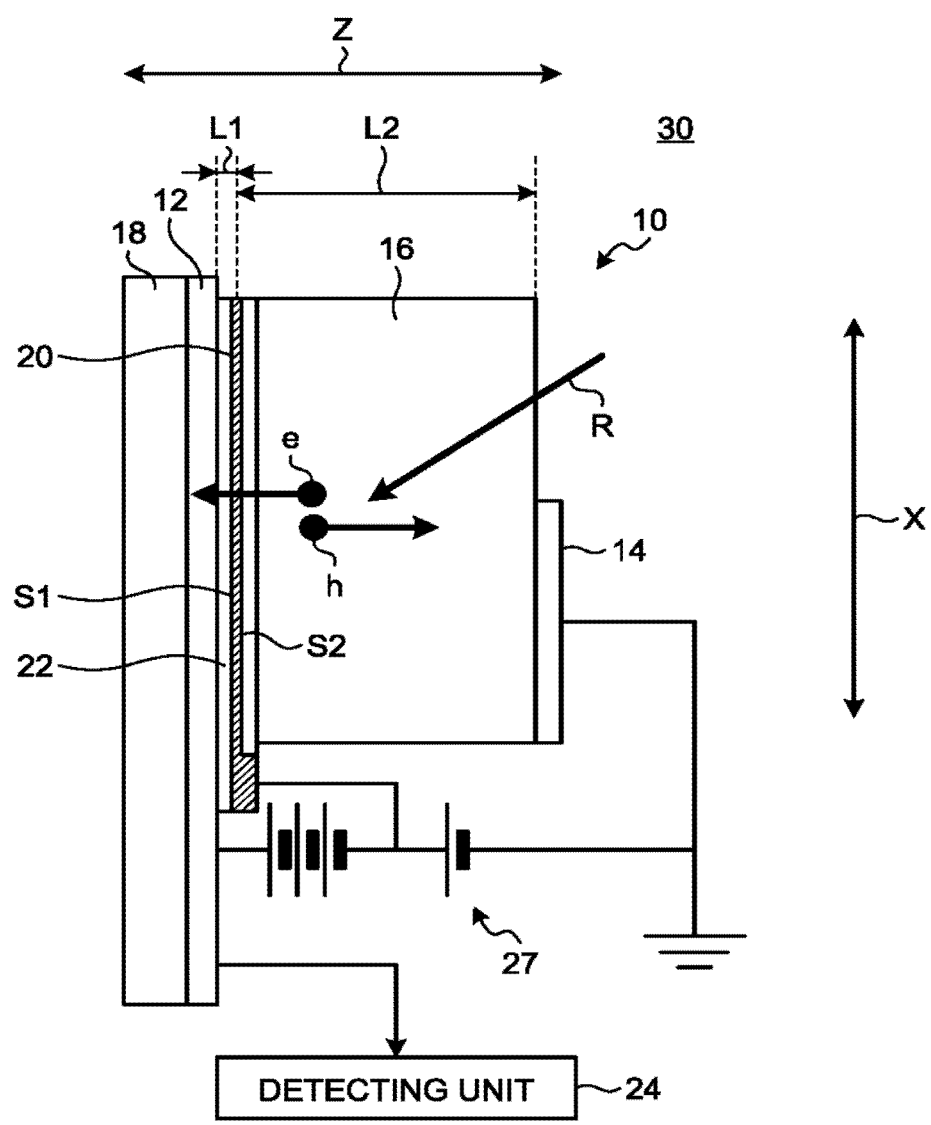
FIGS. 1A to 1C are schematic diagrams illustrating examples of a detector.

FIG. 1A is a schematic diagram illustrating an example of a detector 30 according to a first embodiment.

The detector 30 includes a detecting element 10, a voltage applying unit 27, and a detecting unit 24. Herein, the detecting element 10, the voltage applying unit 27, and the detecting unit 24 are electrically connected to each other.

Firstly, the explanation is given about the detecting element 10. The detecting element 10 includes a substrate 18, a first electrode 12, a second electrode 14, an organic conversion layer 16, and a third electrode 20.

In the first embodiment, the detecting element 10 is a laminated body formed by laminating the first electrode 12, the organic conversion layer 16, and the second electrode 14 in that order on the substrate 18. That is, the organic conversion layer 16 is disposed in between the first electrode 12 and the second electrode 14. The third electrode 20 is disposed at least either in the organic conversion layer 16, or in between the organic conversion layer 16 and the first electrode 12, or in between the organic conversion layer 16 and the second electrode 14 (details are given later). In FIG. 1A is illustrated an example in which the third electrode 20 is disposed in between the first electrode 12 and the organic conversion layer 16 (details are given later).

The first electrode 12 has a bias voltage applied thereto. Moreover, with respect to the organic conversion layer 16, the first electrode 12 is disposed on the downstream side in the direction of incidence of radiation R. In the first embodiment, the radiation R is incident from the side of the second electrode 14 toward the side of the first electrode 12 in the detecting element 10.

The first electrode 12 is electrically connected to the voltage applying unit 27 and the detecting unit 24. The voltage applying unit 27 applies a bias voltage to the first electrode 12. The detecting unit 24 detects output signals that are output from the first electrode 12.

Regarding the first electrode 12, as long as the constituent material thereof has conductive property, there is no restriction on the constituent material. For example, the first electrode 12 is made of indium tin oxide (ITO), graphene, zinc oxide (ZnO), aluminum, or gold. Moreover, there is no restriction on the thickness of the first electrode 12.

With respect to the organic conversion layer 16, the second electrode 14 is disposed on the upstream side in the direction of incidence of the radiation R. In the first embodiment, as compared to the organic conversion layer 16, the second electrode 14 is disposed more on the upstream side in the direction of incidence of the radiation R, and is disposed to abut against the organic conversion layer 16. Meanwhile, in between the second electrode 14 and the organic conversion layer 16, it is possible to have a layer (such as an adhesion layer) that does not affect the electrical field formed between the first electrode 12 and the second electrode 14 and that does not block the transmission of the radiation R of the detection target.

The second electrode 14 is electrically connected to the voltage applying unit 27. Alternatively, the second electrode 14 can be grounded.

The second electrode 14 has conductive property. As long as the constituent material of the second electrode 14 has conductive property and allows transmission of the incident radiation R of the detection target that is incident on the second electrode 14, it serves the purpose. Herein, transmission of the radiation R implies that 50% or more, or desirably 80% or more, of the incident radiation R gets transmitted. For example, the second electrode 14 is made of indium tin oxide (ITO), graphene, zinc oxide (ZnO), aluminum, or gold. Moreover, there is no restriction on the thickness of the second electrode 14.

The organic conversion layer 16 is an organic semiconductor layer that converts the energy of the radiation R into electrical charge. The organic conversion layer 16 is formed in between the first electrode 12 and the second electrode 14.

Examples of the type of the radiation R, which is converted into electrical charge in the organic conversion layer 16, include at least one of beta rays, heavy particle beams, alpha rays, neutron rays, gamma rays, and X rays. In the first embodiment, it is desirable that the organic conversion layer 16 is configured to convert the energy of at least either beta rays, or alpha rays, or neutron rays into electrical charge; and it is particularly desirable that the organic conversion layer 16 is configured to convert the energy of at least beta rays.

Regarding the constituent material of the organic conversion layer 16, as long as the organic material used in known organic semiconductors is present as the main component of the constituent material, it serves the purpose. Herein, the main component implies the component having the content percentage of 70% or more.

For example, the organic material used in the organic conversion layer 16 is selected from at least either a derivative of polyphenylene vinylene (PPV) or a polythiophene polymer.

Examples of the derivative of polyphenylene vinylene include poly[2-methoxy, 5(2'-ethylhexyloxy)-p-phenylenevinylene] (MEH-PPV). Examples of the polythiophene polymer include poly(3-alkylthiophene) such as poly-3-hexylthiophene (P3HT), and dioctylfluorene-bithiophene copolymer (F8T2). It is particularly desirable that poly-3-hexylthiophene (P3HT) and dioctylfluorene-bithiophene copolymer (F8T2) are used in the organic conversion layer 16.

Alternatively, the organic conversion layer 16 can be a mixture of an organic material and an inorganic material. In that case, for example, the organic conversion layer 16 can be a mixture of the abovementioned organic material and fullerene, or a fullerene derivative, or carbon nanotube (CNT) having semiconductivity, or a carbon nanotube (CNT) derivative.

Examples of the fullerene derivative include [6, 6]-phenyl-C61-methyl butyrate (PCBM), fullerene dimer, and a fullerene compound having alkali metal or alkali earth metal introduced therein. The carbon nanotube (CNT) is, for example, a carbon nanotube including fullerene or endohedral metallofullerene. Alternatively, for example, the carbon nanotube (CNT) is a CNT compound in which various molecules are added to the side walls and to the leading end of a carbon nanotube.

There is no restriction on the thickness of the organic conversion layer 16. The thickness direction of the organic conversion layer 16 (the direction of an arrow Z) is coincident with the direction in which the first electrode 12 and the second electrode 14 face each other.

Herein, it is desirable that the detecting element 10 according to the first embodiment puts restraints on detecting gamma rays and X rays and detects the radiation R other than gamma rays and X rays (i.e., detects beta rays, alpha rays, and neutron rays). For that reason, it is desirable that the organic conversion layer 16 has a sufficient thickness for enabling selective transmission of gamma rays and X rays, and for enabling selective conversion of the energy of the radiation R other than gamma rays and X rays (i.e., selective conversion of beta rays, alpha rays, and neutron rays) into electrical charge.

When the organic conversion layer 16 is configured to have a sufficient thickness, it becomes possible to increase the number of electron-hole pairs generated due to the radiation other than gamma rays and X rays (i.e., generated due to beta rays, alpha rays, and neutron rays). Hence, by ensuring a sufficient thickness, it becomes possible to have a configuration that enables selective conversion of the energy of the radiation R other than gamma rays and X rays (i.e., selective conversion of beta rays, alpha rays, and neutron rays) into electrical charge.

Meanwhile, in the following explanation, the thickness direction of the organic conversion layer 16 (the direction of the arrow Z) is sometimes called a thickness direction Z. In the detecting element 10, the thickness direction Z is coincident with the direction of lamination of the substrate 18, the first electrode 12, the organic conversion layer 16, and the second electrode 14. Moreover, the thickness direction Z coincides with the direction in which the first electrode 12 and the second electrode 14 face each other (i.e., the facing direction of the first electrode 12 and the second electrode 14). Meanwhile, in the following explanation, the direction orthogonal to the thickness direction Z (i.e., the direction in an arrow X) is sometimes called a face direction X.

The substrate 18 can be a member capable of supporting the other constituent elements of the detecting element 10. Examples of the substrate 18 include, but are not limited to, a silicon substrate.

Given below is the explanation of the third electrode 20.

The third electrode 20 is electrically connected to the voltage applying unit 27. Alternatively, the third electrode 20 can be grounded. Herein, the third electrode 20 is a sheet-like electrode.

As described above, the third electrode 20 is disposed at least either in the organic conversion layer 16, or in between the organic conversion layer 16 and the first electrode 12, or in between the organic conversion layer 16 and the second electrode 14.

In FIG. 1A is illustrated an example in which the third electrode 20 is disposed in between the first electrode 12 and the organic conversion layer 16.

Figure 1B:
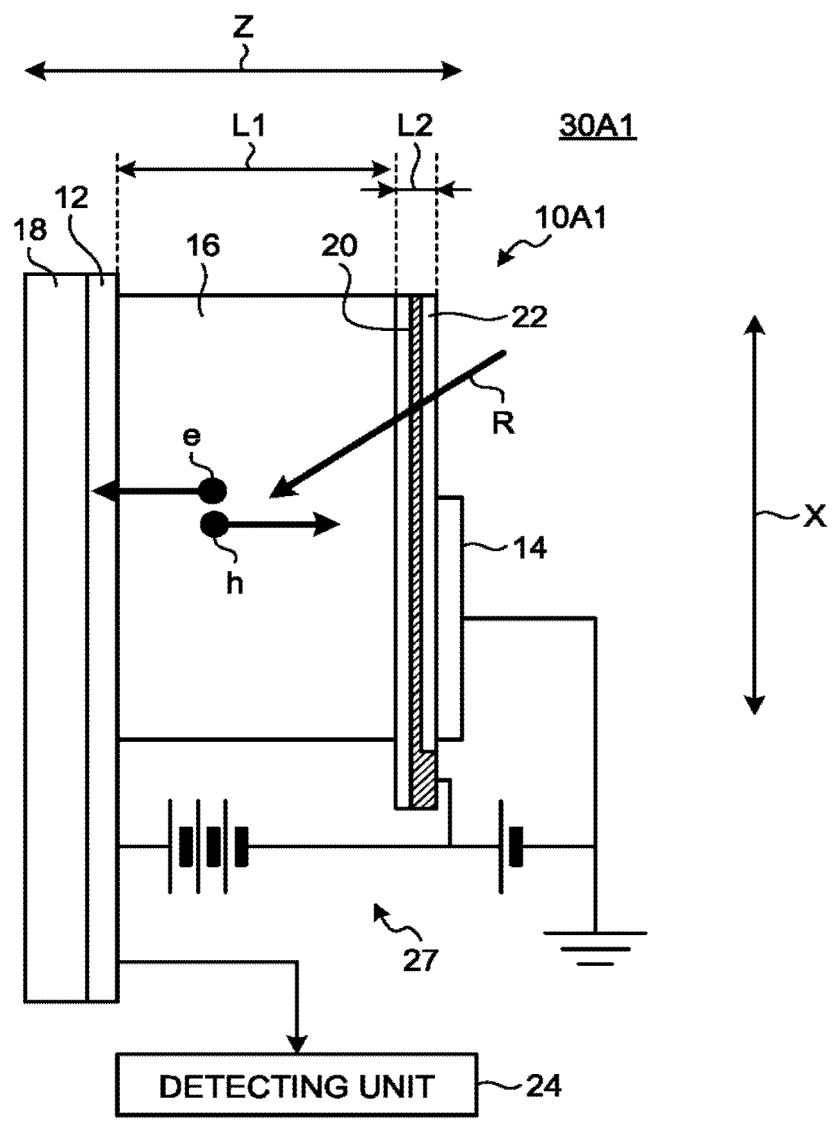

Alternatively, as illustrated in FIG. 1B, the third electrode 20 can be disposed in between the organic conversion layer 16 and the second electrode 14. FIG. 1B is a schematic diagram illustrating an example of a detector 30A1. The detector 30A1 is identical to the detector 30 except that the detecting element 10 is substituted with a detecting element 10A1. Moreover, the detecting element 10A1 is identical to the detecting element 10 except that the third electrode 20 is disposed in between the organic conversion layer 16 and the second electrode 14.

Figure 1C:
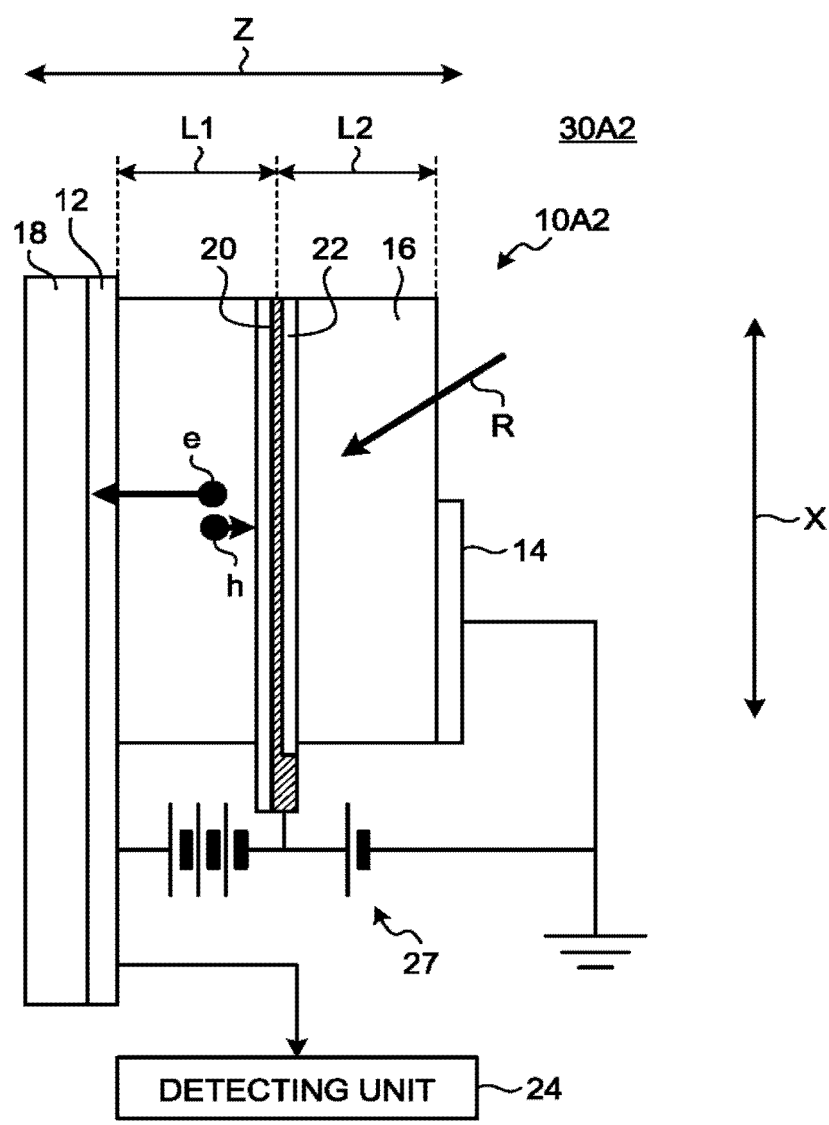

Still alternatively, as illustrated in FIG. 1C, the third electrode 20 can be disposed in the organic conversion layer 16. FIG. 1C is a schematic diagram illustrating an example of a detector 30A2. The detector 30A2 is identical to the detector 30 except that the detecting element 10 is substituted with a detecting element 10A2. Moreover, the detecting element 10A2 is identical to the detecting element 10 except that the third electrode 20 is disposed in the organic conversion layer 16.

Returning to the explanation with reference to FIG. 1A, as long as the position of the third electrode 20 in the thickness direction Z in the detecting element 10 is set at least either in the organic conversion layer 16, or in between the organic conversion layer 16 and the first electrode 12, or in between the organic conversion layer 16 and the second electrode 14; there is no restriction on the position of the third electrode 20 in the thickness direction Z.

For example, the third electrode 20 can be positioned at the center of the thickness direction Z of the organic conversion layer 16 (see FIG. 1C). Alternatively, the third electrode 20 can be positioned more toward the first electrode 12 or more toward the second electrode 14 than the center of the thickness direction Z of the organic conversion layer 16 (see FIGS. 1A and 1B).

Herein, it is desirable that the third electrode 20 is disposed in between the first electrode 12 and the second electrode 14 but closer to either the first electrode 12 or the second electrode 14 than the center of the thickness direction Z of the organic conversion layer 16. That is, it is desirable that a first distance L1 between the first electrode 12 and the third electrode 20 is different than a second distance L2 between the second electrode 14 and the third electrode 20. The first distance L1 is the shortest distance between the first electrode 12 and the third electrode 20 in the thickness direction Z. The second distance L2 is the shortest distance between the second electrode 14 and the third electrode 20 in the thickness direction Z.

Moreover, it is desirable that the third electrode 20 is disposed closer to that electrode, of the first electrode 12 and the second electrode 14, which has a higher electrical potential. The electrical potential of the first electrode 12 and the electrical potential of the second electrode 14 are adjusted according to the voltage values of the voltages applied by the voltage applying unit 27 (described later).

In the first embodiment, the first electrode 12 has a higher electrical potential than the second electrode 14 (details are given later). In that case, it is desirable that the third electrode 20 is disposed closer to the first electrode 12 than the center of the thickness direction Z of the organic conversion layer 16. That is, it is desirable that the first distance L1 between the first electrode 12 and the third electrode 20 is shorter than the second distance L2 between the second electrode 14 and the third electrode 20.

There is no restriction on the position and the range of the third electrode 20 along the face direction X of the organic conversion layer 16. It is desirable that the third electrode 20 is disposed to include at least the facing area between the first electrode 12 and the second electrode 14 along the face direction X of the organic conversion layer 16. Herein, the facing area between the first electrode 12 and the second electrode 14 implies the area in which the first electrode 12 and the second electrode 14 face each other in the organic conversion layer 16.

Moreover, it is desirable that the third electrode 20 is a sheet-like electrode laid across the entire area in the face direction X of the organic conversion layer 16. Herein, the third electrode 20 can be a sheet-like electrode occupying some portion in the face direction X Of the organic conversion layer 16. Alternatively, the third electrode 20 can be configured from a plurality of areas having the same position in the thickness direction Z of the organic conversion layer 16 but having different positions in the face direction X.

Regarding the third electrode 20, as long as the constituent material thereof has conductive property and allows transmission of the radiation R that falls onto the third electrode 20, it serves the purpose.

Meanwhile, it is desirable that the third electrode 20 is made of a conductive carbon material. As a result of using a conductive carbon material as the constituent material of the third electrode 20, the organic conversion layer 16 becomes able to put restraints on converting the energy of gamma rays and X rays into electrical charge.

For example, the third electrode 20 can be made of at least one or more of carbon paper, a porous carbon sheet, an activated carbon sheet, and graphene.

In the first embodiment, the third electrode 20 is covered at least partially by an insulating film 22.

There is no restriction on the position, the size, and the range of the area of the third electrode 20 that is covered by the insulating film 22.

However, it is desirable that at least either an end face S1 on the side of the first electrode 12 or an end face S2 on the side of the second electrode 14 is covered in the thickness direction Z by the insulating film 22. Moreover, as long as the insulating film 22 covers at least some portion of at least either the end face S1 or the end face S2, it serves the purpose. It is desirable that the insulating film 22 covers, in at least either the end face S1 or the end face S2, the entire area applied with a strong electrical field.

Moreover, it is desirable that the end face (the end face S1 or the end face S2) on the side of at least that electrode, of the first electrode 12 and the second electrode 14, which is closer to the third electrode 20 is covered by the insulating film 22.

Meanwhile, in the third electrode 20, the entire area of the end face S1 on the side of the first electrode 12 and the entire area of the end face S2 on the side of the second electrode 14 can be covered by the insulating film 22. Moreover, the third electrode 20 can be disposed inside the insulating film 22. In FIGS. 1A to 1C is illustrated an example in which the entire area of the end face S1 and the entire area of the end face S2 of the third electrode 20 are covered by the insulating film 22.

Regarding the insulating film 22, as long as the constituent material thereof has insulation property and does not block the transmission of the radiation R of the detection target in the detector 30, it serves the purpose. Examples of the insulating film 22 include polyphenylenselfide (PPS), perfluoroalkoxy fluorocarbon resin (PFA), polytetrafluoroethylene (PTFE), block copolymer (BCP), silicon oxide, aluminum oxide, and boric oxide. Of those materials, for the reason of processability, it is desirable to use an organic insulating material such as polyphenylenselfide (PPS).

Moreover, regarding the insulating film 22, as long as the film thickness thereof enables preventing injection of electrical charge from the covered third electrode 20 to the organic conversion layer 16, it serves the purpose. The film thickness of the insulating film 22 implies the shortest distance from the boundary between the third electrode 20 and the insulating film 22 to the top surface of the insulating film 22. The thickness of the insulating film 22 can be adjusted according to the configuration of the detecting element 10 and the voltage values of the voltages applied by the voltage applying unit 27.

Given below is the explanation of the voltage applying unit 27. The voltage applying unit 27 applies a bias voltage to the first electrode 12. In the first embodiment, in addition to applying a bias voltage to the first electrode 12, the voltage applying unit 27 applies a voltage to the third electrode 20 and a voltage to the second electrode 14.

In the first embodiment, the voltage applying unit 27 applies voltages to the first electrode 12, the third electrode 20, and the second electrode 14 in such a way that the electrical field generated between the third electrode 20 and the first electrode 12 becomes stronger than the electrical field generated between the second electrode 14 and the third electrode 20.

Consequently, the third electrode 20 is applied with the voltage having a lower voltage value than the first electrode 12. Moreover, the second electrode 14 is applied with the voltage having a lower voltage value than the first electrode 12 and the third electrode 20. Herein, it is desirable that a first potential difference between the first electrode 12 and the third electrode 20 is greater than a second potential difference between the second electrode 14 and the third electrode 20. Such potential differences can be implemented by adjusting the voltage value of the voltage applied to at least either the first electrode 12, or the third electrode 20, or the second electrode 14.

In the first embodiment, the voltage applying unit 27 adjusts the voltage values applied to the first electrode 12, the third electrode 20, and the second electrode 14; and adjusts the first electrode 12, the third electrode 20, and the second electrode 14 to have different electrical potentials. For example, the voltage applying unit 27 applies voltages in such a way that the first electrode 12 has the highest electrical potential, and then the electrical potential decreases in order of the third electrode 20 and the second electrode 14. As a result of the adjustment of the voltage values of the applied voltages as performed by the voltage applying unit 27, the first potential difference between the first electrode 12 and the third electrode 20 can be set to be greater than the second potential difference between the second electrode 14 and the third electrode 20.

The detecting unit 24 detects output signals that are output from the first electrode 12. The output signals indicate the quantity of electrical charge obtained by conversion in the organic conversion layer 16. In other words, the magnitude of the output signals is proportional to the detected energy of the radiation R as detected in the organic conversion layer 16. The detecting unit 24 converts the quantity of electrical charge, which is detected in the organic conversion layer 16, into signals measurable using a charge amplifier. Meanwhile, in the first embodiment, for ease of explanation, it is assumed that the detecting unit 24 receives the output signals from the first electrode 12.

The detecting unit 24 derives the detected energy of the radiation R based on the output signals received from the first electrode 12. Herein, a known method can be implemented to derive the detected energy.

Method for Manufacturing Detector

Given below is the explanation of a method for manufacturing the detector 30. There is no restriction on the method for manufacturing the detector 30. For example, the detector 30 is manufactured according to the sequence given below.

Firstly, the first electrode 12 is formed on the substrate 18. Moreover, an insulating film material of the insulating film 22 is prepared, the third electrode 20 is formed on the insulating film material, and then an insulating film member of the insulating film 22 is laminated. Subsequently, the third electrode 20, which is manufactured as a result of the lamination operation and which is covered by the insulating film 22 (the insulating film member), is pasted onto the first electrode 12. Then, the organic conversion layer 16 is laminated, and that is followed by laminating the second electrode 14, so that the detecting element 10 is manufactured.

Regarding the method for laminating the first electrode 12, the organic conversion layer 16, the insulating film 22, the third electrode 20, and the second electrode 14; a known film formation method or a known manufacturing method can be implemented.

Subsequently, the first electrode 12, the third electrode 20, and the second electrode 14 are electrically connected to the voltage applying unit 27. Moreover, the first electrode 12 is electrically connected to the detecting unit 24. In this way, the detector 30 is manufactured according to the sequence described above.

Actions of Detecting Element

Given below is the explanation of the actions of the detecting element 10.

The radiation R falls onto the detecting element 10 and reaches the organic conversion layer 16. Because of the radiation R that has reached the organic conversion layer 16, electron-hole pairs of electrons e and holes h are generated in the organic conversion layer 16. More specifically, in the organic conversion layer 16, electron-hole pairs are generated at various positions in the thickness direction Z and the face direction X of the organic conversion layer 16. Of the electron-hole pairs, the holes h move toward the second electrode 14, and the electrons e move toward the first electrode 12.

As described above, in the first embodiment, the voltage applying unit 27 applies voltages to the first electrode 12, the third electrode 20, and the second electrode 14 in such a way that the electrical field between the second electrode 14 and the third electrode 20 is stronger than the electrical field between the first electrode 12, which has a bias voltage applied thereto, and the third electrode 20.

Hence, the electrical potentials among the first electrode 12, the third electrode 20, and the second electrode 14 become as illustrated in FIG. 2. FIG. 2 is a diagram illustrating an example of the electrical potential of the detecting element 10. Herein, the position of the first electrode 12 is illustrated as a position $z=0$ in the thickness direction Z. The position of the second electrode 14 is illustrated as a position $z=1$ in the thickness direction Z. The position of the third electrode 20 is illustrated as $z=P$ in the thickness direction Z. The position $z=P$ satisfies the relationship of $0<P<1$.

As illustrated in FIG. 2, a first potential difference M1 between the first electrode 12 and the third electrode 20 is greater than a second electrical potential M2 between the second electrode 14 and the third electrode 20. Moreover, as compared to the slope of a line 40A indicating the electrical potential between the second electrode 14 and the third electrode 20, a line 40B indicating the electrical potential between the third electrode 20 and the first electrode 12 has a greater slope. Meanwhile, the slopes of the lines 40 (the lines 40A and 40B) correspond to the strength of the electrical field in the thickness direction Z of the organic conversion layer 16 (i.e., corresponds to the potential difference per unit distance).

Herein, greater the potential difference per unit distance (greater the slope of the lines 40), the greater becomes the magnitude of the output signals. Moreover, greater the number of electron-hole pairs generated in the organic conversion layer 16, the greater becomes the magnitude of the output signals. Furthermore, greater the potential difference at the positions to which the electrons generated in the organic conversion layer 16 move during the period from their generation to their extinction, the greater becomes the magnitude of the output signals. In an identical manner, greater the potential difference at the positions to which the holes generated in the organic conversion layer 16 move during the period from their generation to their extinction, the greater becomes the magnitude of the output signals.

As a result, the output signals happen to include the effect related to the potential difference at the positions to which the electrons or the holes moved. If the distance for which the electrons and the holes move is always constant and if the electrical field for movement in the organic conversion layer 16 is always constant, then the effect related to the potential difference at the positions to which the electrons and the holes moved always becomes constant. Hence, it no more becomes necessary to take into account the effect of the positions of generation of the electron-hole pairs on the output signals.

However, in practice, there are some electrons that do not become extinct in the organic conversion layer 16 but that reach the first electrode 12, and there are some holes that do not become extinct in the organic conversion layer 16 but that reach the second electrode 14. In that case, if there are different positions of generation of the electron-hole pairs, then it results in different potential differences at the positions to which the electrons and the holes move. As a result, the positions of generation of the electron-hole generation significantly affect the output signals.

Meanwhile, longer the distance for which the radiation R passes through the organic conversion layer 16, the greater becomes the number of electron-hole pairs generated in the organic conversion layer 16 due to the radiation R. Hence, in order to enhance the sensitivity for detection of the radiation R, it is required to increase the number of electron-hole pairs, which are generated due to the radiation R, by increasing the thickness of the organic conversion layer 16. However, if the thickness of the organic conversion layer 16 is increased, the effect of the difference in the positions of generation of the electron-hole pairs conspicuously appears in the output signals.

In the first embodiment, in the organic conversion layer 16, the third electrode 20 is disposed either in between the organic conversion layer 16 and the first electrode 12 or in between the organic conversion layer 16 and the second electrode 14. Hence, the first potential difference M1 between the third electrode 20 and the first electrode 12 can be set to be greater than the second electrical potential M2 between the second electrode 14 and the third electrode 20.

Thus, in the detecting element 10 according to the first embodiment, in the area in between the second electrode 14 and the third electrode 20, since the potential difference per unit distance is small, after the electrons and the holes are generated, the potential difference becomes small in the case of movement of the electrons and the holes in between the second electrode 14 and the third electrode 20, and the magnitude of the output signals that are output due to the movement also becomes small. Moreover, a majority of the electrons generated between the second electrode 14 and the third electrode 20 pass through the third electrode 20 and reach the first electrode 12.

In that case, the potential difference at the positions to which the electrons move is constant and always equal to the potential difference between the third electrode 20 and the first electrode 12, and thus the output signals that are output due to the movement of the electrons from the third electrode 20 to the first electrode 12 are dependent only on the number of moving electrons and the potential difference between the electrodes.

That is, in the detecting element 10 according to the first embodiment, as a result of installing the third electrode 20, it becomes possible to achieve an area having a small potential difference (the second potential difference M2) in the organic conversion layer 16 and to hold down the positional dependency related to the positions of generation of the electron-hole pairs. Moreover, in the detecting element 10, as a result of installing the third electrode 20, the electrical potential on the side of the first electrode 12 can be increased, thereby enabling prevention of any decline in the detection accuracy.

Herein, as a result of installing the third electrode 20, it becomes possible to hold down the positional dependency related to the positions of generation of the electron-hole pairs in the thickness direction Z of the organic conversion layer 16. However, as a result of installing the third electrode 20, the electrical field between the first electrode 12 and the third electrode 20 becomes strong or the electrical field between the first electrode 12 and the third electrode 20 becomes strong. That results in an occasional increase in the dark current flowing through the organic conversion layer 16, and results an occasional increase in noise signals attributed to the dark current in the output signals. That is believed to occur because electrical charge (electrons and holes) gets injected from the third electrode 20 to the organic conversion layer 16 due to a strong electrical field.

In that regard, as described above, in the detecting element 10 according to the first embodiment, the third electrode 20 is at least partially covered by the insulating film 22.

As a result, it becomes possible to prevent injection of electrical charge (electrons and holes) from the third electrode 20 to the organic conversion layer 16, and to hold down the dark current in the organic conversion layer 16. That is, in the detecting element 10 according to the first embodiment, it becomes possible to prevent a situation in which noise signals attributed to the dark signals get included in the output signals.

As described above, the detecting element 10 according to the first embodiment includes the first electrode 12 to which a bias voltage is applied; the second electrode 14; the organic conversion layer 16; and the third electrode 20. The organic conversion layer 16 is disposed in between the first electrode 12 and the second electrode 14, and converts the energy of the radiation R into electrical charge. The third electrode 20 is disposed at least either in the organic conversion layer 16, or in between the organic conversion layer 16 and the first electrode 12, or in between the organic conversion layer 16 and the second electrode 14; and is at least partially covered by the insulating film 22.

The detecting element 10 includes the third electrode 20. Hence, as described earlier, the output signals that are output from the first electrode 12 are prevented from having the positional dependency related to the positions of generation of the electron-hole pairs in the thickness direction Z of the organic conversion layer 16. Moreover, since the third electrode 20 is at least partially covered by the insulating film 22, the output signals are prevented from including noise signals attributed to the dark current.

Thus, in the detecting element 10 according to the first embodiment, it becomes possible to enhance the sensitivity for detection of the radiation R.

Moreover, in the detecting element 10 according to the first embodiment, the third electrode 20 is at least partially covered by the insulating film 22. Hence, even if the voltage is applied in such a way that, of the pair of the first electrode 12 and the third electrode 20 and the pair of the third electrode 20 and the second electrode 14, the pair of electrodes having a shorter distance therebetween has a stronger electrical field therebetween than the electrical field between the other pair of electrodes; the injection of electrical charge from the third electrode 20 to the organic conversion layer 16 can be held down in an effective manner.

Moreover, in the detecting element 10 according to the first embodiment, the third electrode 20 is at least partially covered by the insulating film 22. Hence, even if either one of the first distance L1 between the first electrode 12 and the third electrode 20 and the second distance L2 between the third electrode 20 and the second electrode 14 is equal to or greater than 10 times the other (i.e., even if L2×10≤L1 holds true or even if L1×10≤L2 holds true); the injection of electrical charge from the third electrode 20 to the organic conversion layer 16 can be held down in an effective manner.

Furthermore, in the detecting element 10 according to the first embodiment, the third electrode 20 is at least partially covered by the insulating film 22. Hence, even if one of the first potential difference M1 between the first electrode 12 and the third electrode 20 and the second potential difference M2 between the second electrode 14 and the third electrode 20 is greater than the other (for example, equal to or greater than twice); the injection of electrical charge from the third electrode 20 to the organic conversion layer 16 can be held down in an effective manner.

Second Embodiment

In a second embodiment, the explanation is given for a configuration in which the third electrode 20 has through holes 26 formed therein.

Figure 3A:
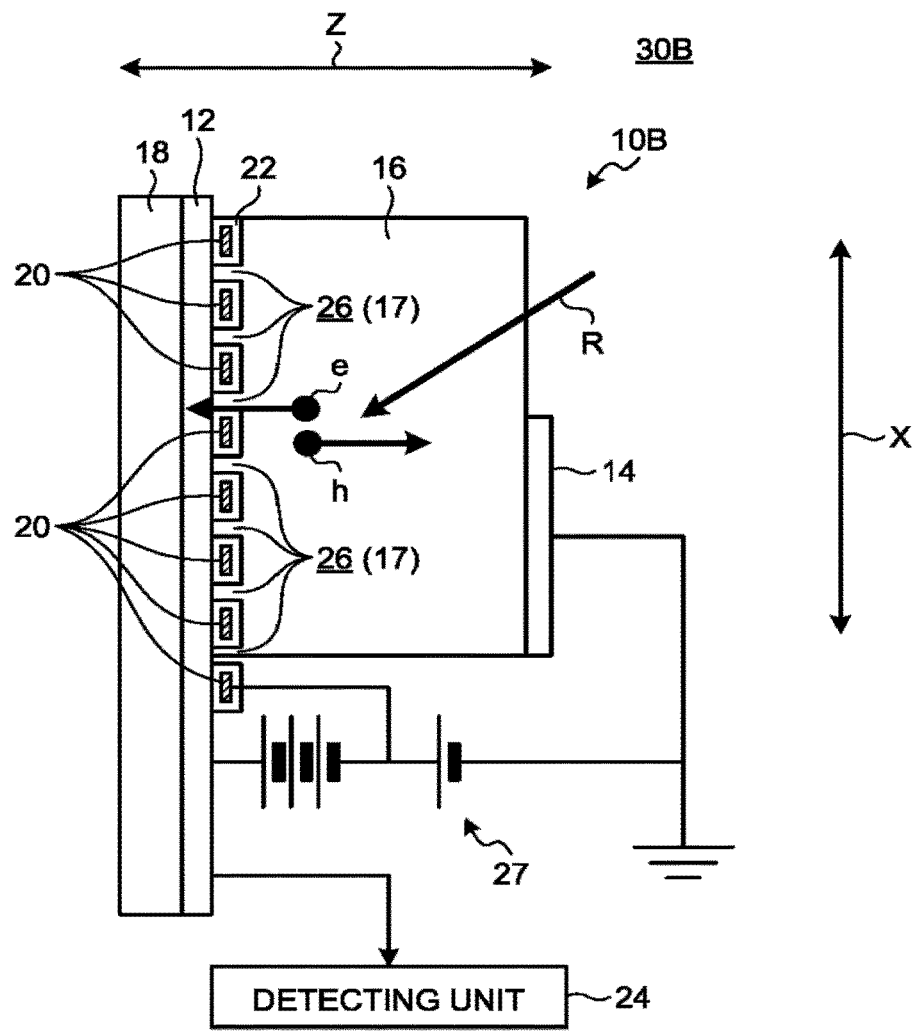
FIG. 3A is a schematic diagram illustrating an example of the detector.

FIG. 3A is a schematic diagram illustrating an example of a detector 30B according to the second embodiment. Herein, the functional constituent elements identical to the detector 30 according to the first embodiment are referred to by the same reference numerals, and the detailed explanation thereof is not given again.

The detector 30B includes a detecting element 10B, the detecting unit 24, and the voltage applying unit 27. Herein, the detecting element 10B, the voltage applying unit 27, and the detecting unit 24 are electrically connected to each other. Moreover, the voltage applying unit 27 and the detecting unit 24 are identical to the first embodiment.

The detecting element 10B includes the substrate 18; the first electrode 12; the second electrode 14; the organic conversion layer 16; and the third electrodes 20 that are at least partially covered by the insulating film 22. Herein, the substrate 18, the first electrode 12, the second electrode 14, the organic conversion layer 16, the third electrodes 20, and the insulating film 22 are identical to the first embodiment.

In the second embodiment, each third electrode 20 has one or more through holes 26 formed therein in a penetrating manner along the thickness direction Z of the organic conversion layer 16.

Herein, it is desirable that the through holes 26 are filled with a constituent material 17 of the organic conversion layer 16. The constituent material 17 of the organic conversion layer 16 implies the material constituting the organic conversion layer 16. Thus, the inside of the through holes 26 and the organic conversion layer 16 represent a continuous phase attributed to the same constituent material 17.

There is no restriction on the size and the shape of the through holes 26.

Figure 3B:
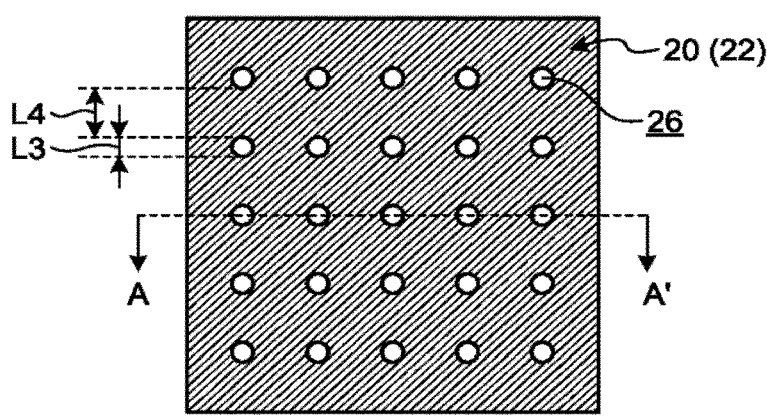
FIG. 3B is an exemplary planar view of a third electrode.

When each third electrode 20 has a plurality of through holes 26 formed therein, it is desirable that the through holes 26 having the same size are formed in the third electrode 20 at equally spaced intervals along the direction intersecting with the thickness direction Z (i.e., along the face direction X). FIG. 3B is an exemplary planar view of the third electrode 20. Herein, FIG. 3B is a planar view in which the third electrode 20 in the detecting element 10B is viewed from the thickness direction Z of the detecting element 10B. Thus, A-A' cross-section of the third electrode 20 illustrated in FIG. 3B corresponds to the detector 30B illustrated in FIG. 3A.

When the through holes 26 having the same size are formed at equally spaced intervals along the face direction X of the third electrodes 20, it becomes possible to hold down the variation in the sensitivity for detection attributed to the position of the detecting element 10B in the face direction X.

When the through holes 26 having the same size and the same shape are formed at equally spaced intervals along the face direction X, it is desirable that a maximum length L3 of each through hole 26 is shorter than a shortest distance L4 to the neighboring through hole 26 (i.e., L3<L4 holds true). Herein, the maximum length L3 of each through hole 26 implies the maximum length on the cross-sectional surface that is orthogonal to the direction of penetration of the through holes 26. Moreover, the shortest distance L4 between the neighboring through holes 26 implies the shortest distance between the peripheral borders of the neighboring through holes 26 in the plane orthogonal to the direction of penetration of the through holes 26.

As illustrated in FIG. 3B, it is desirable that each third electrode 20 is formed as a netlike sheet because of the through holes 26. There is no restriction on the shape of the through holes 26. For example, the through holes 26 can be circular or rectangular in shape.

It is desirable that the direction of penetration of the through holes 26 is coincident with the perpendicular direction with respect to the electrode, of the first electrode 12 and the second electrode 14, which is closer to the third electrodes 20 (i.e., with respect to the first electrode 12 or the second electrode 14). That is, it is desirable that the direction of penetration of the through holes 26 is coincident with the thickness direction Z of the organic conversion layer 16.

Meanwhile, when the third electrodes 20 have the through holes 26 formed therein, it is desirable that the top surface of the through holes 26 is covered by the insulating film 22.

As described above, in the detecting element 10B according to the second embodiment, the third electrodes 20 have the through holes 26 formed therein.

When the through holes 26 are formed in the third electrodes 20, the inside of the through holes 26 gets applied with a stronger electrical field than the outside of the through holes 26. Hence, in the detecting element 10B according to the second embodiment, it becomes possible to further hold down the positional dependency related to the positions of generation of the electron-hole pairs in the thickness direction Z of the organic conversion layer 16. Moreover, since the third electrodes 20 are at least partially covered by the insulating film 22, the injection of electrical charge from the third electrodes 20 to the organic conversion layer 16 can be held down in an effective manner.

Thus, in the detecting element 10B according to the third embodiment, it becomes possible to further enhance the sensitivity for detection of the radiation R.

Moreover, when the third electrodes 20 have the through holes 26 formed therein, it becomes possible to prevent conversion of the energy of gamma rays and X rays into electrical charge in the organic conversion layer 16. Hence, in the organic conversion layer 16, the energy of the radiation R other than gamma rays and X rays (i.e., the energy of beta rays, alpha rays, and neutron rays) can be selectively converted into electrical charge. That is believed to occur because the gamma rays and the X rays included in the radiation R falling on the organic conversion layer 16 do not get transmitted through the organic conversion layer 16 because of the third electrodes 20, and can be prevented from getting converted into electrical charge in the organic conversion layer 16.

Third Embodiment

In a third embodiment, the explanation is given about a configuration in which the third electrodes 20 have hole portions 28 formed therein.

Figure 4:
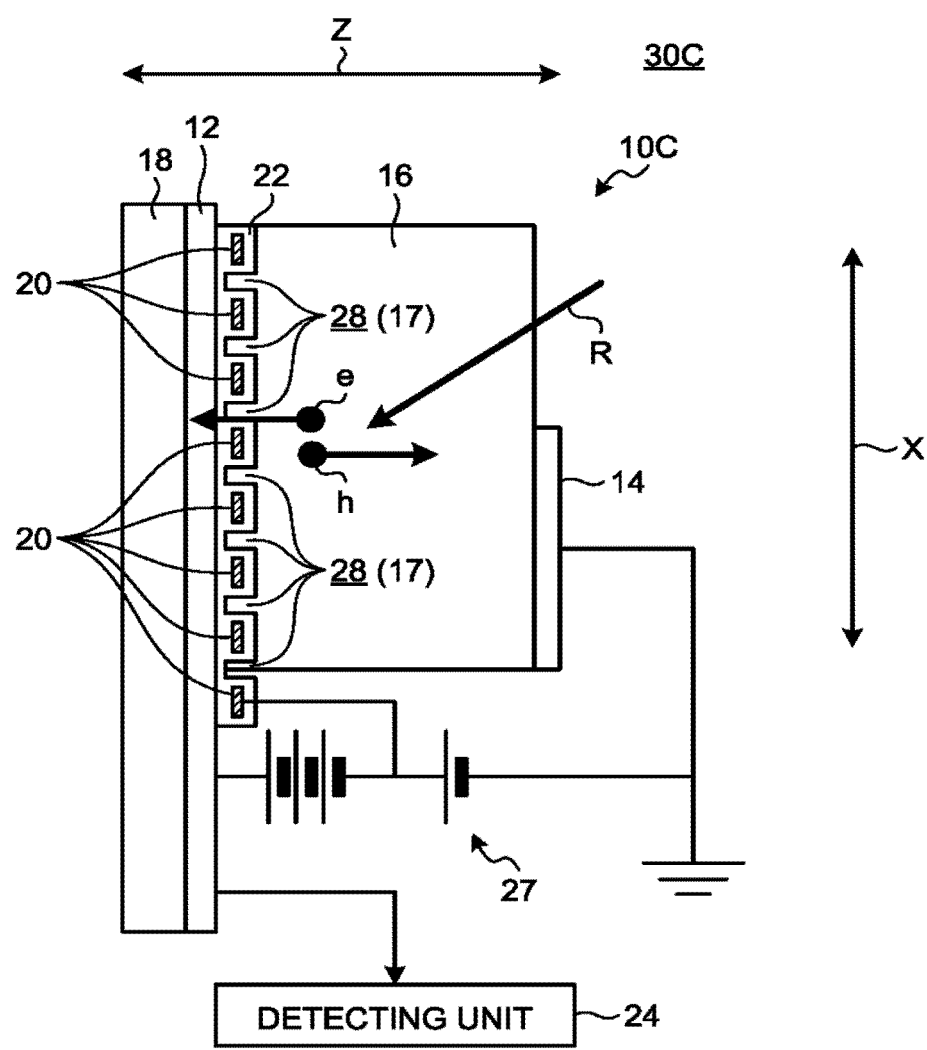
FIGS. 4 to 7 are schematic diagrams illustrating examples of the detector.

FIG. 4 is a schematic diagram illustrating an example of a detector 30C according to the third embodiment. Herein, the functional constituent elements identical to the detector 30 according to the first embodiment are referred to by the same reference numerals, and the detailed explanation thereof is not given again.

The detector 30C includes a detecting element 10C, the detecting unit 24, and the voltage applying unit 27. Herein, the detecting element 10C, the voltage applying unit 27, and the detecting unit 24 are electrically connected to each other. Moreover, the voltage applying unit 27 and the detecting unit 24 are identical to the first embodiment.

The detecting element 10C includes the substrate 18; the first electrode 12; the second electrode 14; the organic conversion layer 16; and the third electrodes 20 that are at least partially covered by the insulating film 22. Herein, the substrate 18, the first electrode 12, the second electrode 14, the organic conversion layer 16, the third electrodes 20, and the insulating film 22 are identical to the first embodiment.

In the third embodiment, each third electrode 20 has one or more hole portions 28 formed therein with the opening present either on the side of the first electrode 12 or on the side of the second electrode 14.

It is desirable that the hole portions 28 are filled with the constituent material 17 of the organic conversion layer 16. Thus, the inside of the hole portions 28 and the organic conversion layer 16 represent a continuous phase attributed to the same constituent material 17.

There is no restriction on the size and the shape of the hole portions 28.

When the third electrodes 20 have a plurality of hole portions 28 formed therein, it is desirable that the hole portions 28 having the same size are formed in the third electrodes 20 at equally spaced intervals along the direction intersecting with the thickness direction Z (i.e., along the face direction X).

When the hole portions 28 having the same size and the same shape are formed at equally spaced intervals along the face direction X, it is desirable that the maximum length of each hole portion 28 is shorter than the shortest distance to the neighboring hole portion 28. Herein, the maximum length of each hole portion 28 implies the maximum length on the cross-sectional surface orthogonal to the depth direction of the hole portions 28. Moreover, the shortest distance between the neighboring hole portions 28 implies the shortest distance between the peripheral borders of the neighboring hole portions 28 in the plane orthogonal to the depth direction of the hole portions 28.

When the hole portions 28 having the same size are formed at equally spaced intervals along the face direction X of the third electrodes 20, it becomes possible to hold down the variation in the sensitivity for detection attributed to position of the detecting element 10C in the face direction X.

There is no restriction on the shape of the hole portions 28. For example, the cross-sectional surface of the hole portions 28 along the face direction X can be circular or rectangular in shape.

It is desirable that the depth direction of the hole portions 28 is coincident with the perpendicular direction with respect to the electrode, of the first electrode 12 and the second electrode 14, which is closer to the third electrodes 20 (i.e., with respect to the first electrode 12 or the second electrode 14). That is, it is desirable that the depth direction of the hole portions 28 is coincident with the thickness direction Z of the organic conversion layer 16.

As described above, the opening of the hole portions 28 can be present either on the side of the first electrode 12 or on the side of the second electrode 14. Alternatively, in a single third electrode 20, a plurality of types of hole portions 28 having different opening directions can be formed. For example, in a single third electrode 20, the hole portions 28 having the opening on the side of the second electrode 14 can be formed along with the hole portions 28 having the opening on the side of the first electrode 12.

Moreover, it is desirable that each hole portion 28 has the opening on the side of the electrode, of the first electrode 12 and the second electrode 14, which is farther from the third electrode 20 in which the concerned hole portion 28 is formed (i.e., on the side of the first electrode 12 or the second electrode 14). More particularly, as illustrated in FIG. 4, when the third electrodes 20 are disposed in between the first electrode 12 and the organic conversion layer 16, it is desirable that the hole portions 28 formed on the third electrodes 20 have the opening on the side of the second electrode 14.

When the hole portions 28 have the opening on the side of the farther electrode from among the first electrode 12 and the second electrode 14 (i.e., on the side of the first electrode 12 or the second electrode 14), it becomes possible to hold down the amount of dark current flowing to the closer electrode (the second electrode 14 or the first electrode 12) due to the concentration of electrical field inside the hole portions 28.

Meanwhile, when the third electrodes 20 have the hole portions 28 formed therein, it is desirable that the top surface of the hole portions 28 is covered by the insulating film 22.

As described above, in the detecting element 10C according to the third embodiment, the third electrodes 20 have the hole portions 28 formed therein.

When the third electrodes 20 have the hole portions 28 formed therein, the inside of the hole portions 28 gets applied with a stronger electrical field than the outside of the hole portions 28. Hence, in the detecting element 10C according to the third embodiment, it becomes possible to further hold down the positional dependency related to the positions of generation of the electron-hole pairs in the thickness direction Z of the organic conversion layer 16. Moreover, since the third electrodes 20 are at least partially covered by the insulating film 22, the injection of electrical charge from the third electrodes 20 to the organic conversion layer 16 can be held down in an effective manner.

Thus, in the detecting element 10C according to the third embodiment, it becomes possible to further enhance the sensitivity for detection of the radiation R.

As described earlier, it is desirable that each hole portion 28 has the opening on the side of the electrode, of the first electrode 12 and the second electrode 14, which is farther from the third electrode 20 in which the concerned hole portion 28 is formed (i.e., on the side of the first electrode 12 or the second electrode 14). When the hole portions 28 have the opening on the side of the farther electrode, the insulating film 22 can be laid in between the bottom of the hole portions 28 and the first electrode 12.

Meanwhile, the third electrodes 20 can have the through holes 26 as well as the portions 28 formed therein.

First Modification Example

As described earlier in the first embodiment, as long as the third electrode 20 is disposed at least either in the organic conversion layer 16, or in between the organic conversion layer 16 and the first electrode 12, or in between the organic conversion layer 16 and the second electrode 14, it serves the purpose. Thus, the third electrode 20 can be disposed in between the organic conversion layer 16 and the first electrode 12 as well as in between the organic conversion layer 16 and the second electrode 14.

Moreover, as described earlier in the embodiments, each third electrodes 20 can have at least either one or more through holes 26 or one or more hole portions 28 formed therein.

Figure 5:
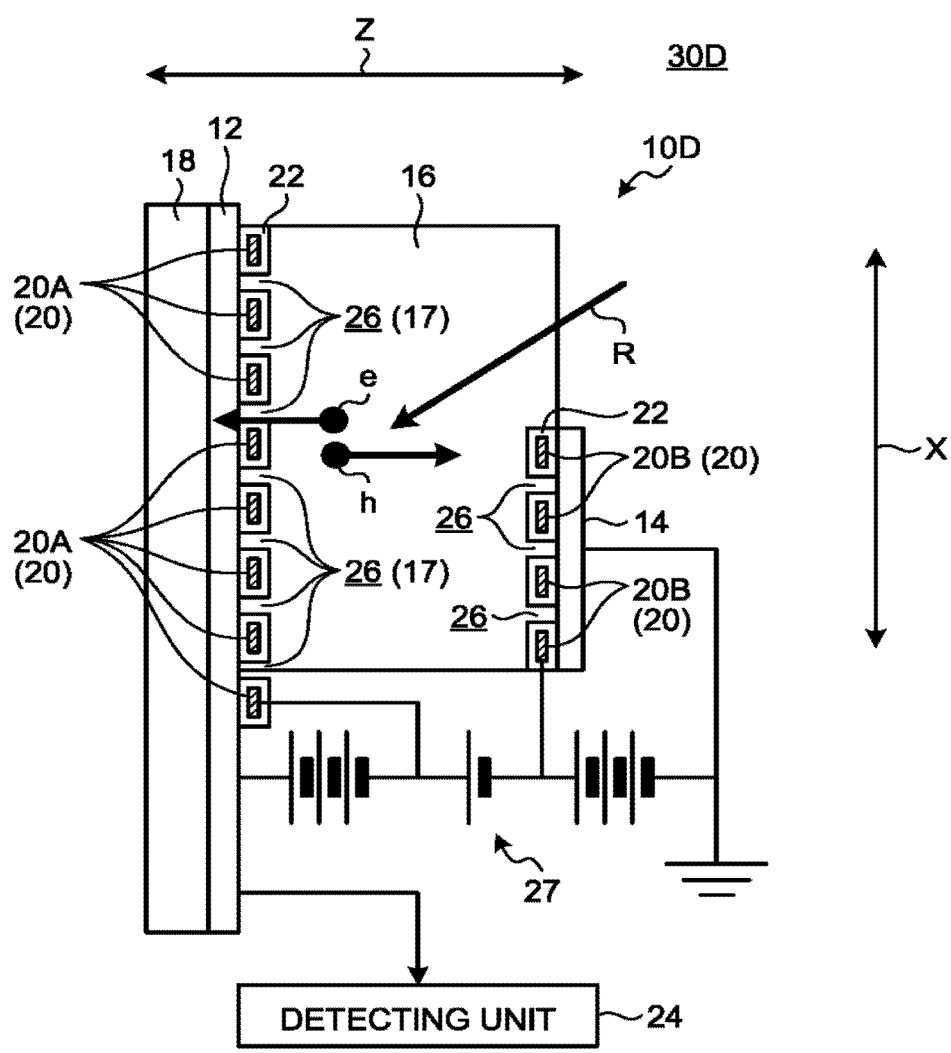

FIG. 5 is a schematic diagram illustrating an example of a detector 30D according to a first modification example.

The detector 30D includes a detecting element 10D, the detecting unit 24, and the voltage applying unit 27. Herein, the detecting element 10D, the voltage applying unit 27, and the detecting unit 24 are electrically connected to each other. Moreover, the voltage applying unit 27 and the detecting unit 24 are identical to the first embodiment.

The detecting element 10D includes the substrate 18; the first electrode 12; the second electrode 14; the organic conversion layer 16; and the third electrodes 20 that are at least partially covered by the insulating film 22. Herein, the substrate 18, the first electrode 12, the second electrode 14, the organic conversion layer 16, the third electrodes 20, and the insulating film 22 are identical to the first embodiment.

In the first modification example, in the detecting element 10D, the third electrodes 20 are disposed in between the first electrode 12 and the organic conversion layer 16 as well as in between the organic conversion layer and the second electrode 14. The third electrodes 20 that are disposed in between the first electrode 12 and the organic conversion layer 16 are referred to as third electrodes 20A. Similarly, the third electrodes that are disposed in between the organic conversion layer 16 and the second electrode 14 are referred to as third electrodes 20B. In an identical manner to the embodiments described earlier, the third electrodes 20 are covered by the insulating film 22.

As described earlier in the embodiments, the third electrodes 20 (the third electrodes 20A and the third electrodes 20B) can have at least either the through holes 26 or the hole portions 28 formed therein. In FIG. 5 is illustrated an example in which the third electrodes 20A as well as the third electrodes 20B have the through holes 26 formed therein. Moreover, in an identical manner to the embodiments described earlier, the through holes 26 are filled with the constituent material 17 of the organic conversion layer 16.

When the detecting element 10D includes a plurality of third electrodes 20, the voltage applying unit 27 can apply voltages in such a way that the first electrode 12, the third electrodes 20A, the third electrodes 20B, and the second electrode 14 have mutually different electrical potentials.

More particularly, the voltage applying unit 27 can apply voltages to the first electrode 12, the third electrodes 20A, the third electrodes 20B, and the second electrode 14 in such a way that the first electrode 12 has the highest electrical potential and the electrical potential goes on decreasing in a stepwise manner in order of the third electrodes 20A, the third electrodes 20B, and the second electrode 14.

As described above, in the detector 30D according to the first modification example, the third electrodes 20 are disposed in between the first electrode 12 and the organic conversion layer 16 as well as in between the organic conversion layer 16 and the second electrode 14. As a result of disposing the third electrodes 20 (the third electrodes 20A and the third electrodes 20B) in between the first electrode 12 and the organic conversion layer 16 as well as in between the organic conversion layer 16 and the second electrode 14; for example, if the third electrodes 20 are installed close to only the first electrode 12, it becomes possible to hold down the amount of electrical charge accumulating at the boundary face between the organic conversion layer 16 and the second electrode 14.

Hence, in the detector 30D according to the first modification example, in addition to achieving the effects according to the embodiments described above, it becomes possible to prevent malfunctioning of the detector 30D attributed to a strong spike noise.

Moreover, in the detecting element 10D according to the first modification example, the third electrodes 20 (the third electrodes 20A and the third electrodes 20B) are at least partially covered by the insulating film 22. Hence, even if the shortest distance among the third electrodes 20A and among the third electrodes 20B is set to be equal to or greater than 10 times the shortest distance between the first electrode 12 and the third electrodes 20A and equal to or greater than 10 times the shortest distance between the third electrodes 20B and the second electrode 14; the injection of electrical charge from the third electrodes 20 to the organic conversion layer 16 can be held down in an effective manner.

Furthermore, in the detecting element 10D according to the first modification example, the third electrodes 20 (the third electrodes 20A and the third electrodes 20B) are at least partially covered by the insulating film 22. Hence, even if a third potential difference among the third electrodes 20A and the third electrodes 20B is smaller than a fourth potential difference between the first electrode 12 and the third electrodes 20A and smaller than a fifth potential difference between the third electrodes 20B and the second electrode 14; the injection of electrical charge from the third electrodes 20 (the third electrodes 20A and the third electrodes 20B) to the organic conversion layer 16 can be held down in an effective manner.

Second Modification Example

As described earlier in the first embodiment, the third electrode 20 is at least partially covered by the insulating film 22.

Thus, the third electrode 20 can be configured to have the entire top surface thereof covered by the insulating film 22. In other words, the third electrode 20 can be disposed inside the insulating film 22.

In that case, a plurality of third electrodes 20 having mutually different positions in the thickness direction Z of the organic conversion layer 16 can be disposed in a single insulating film 22.

Figure 6:
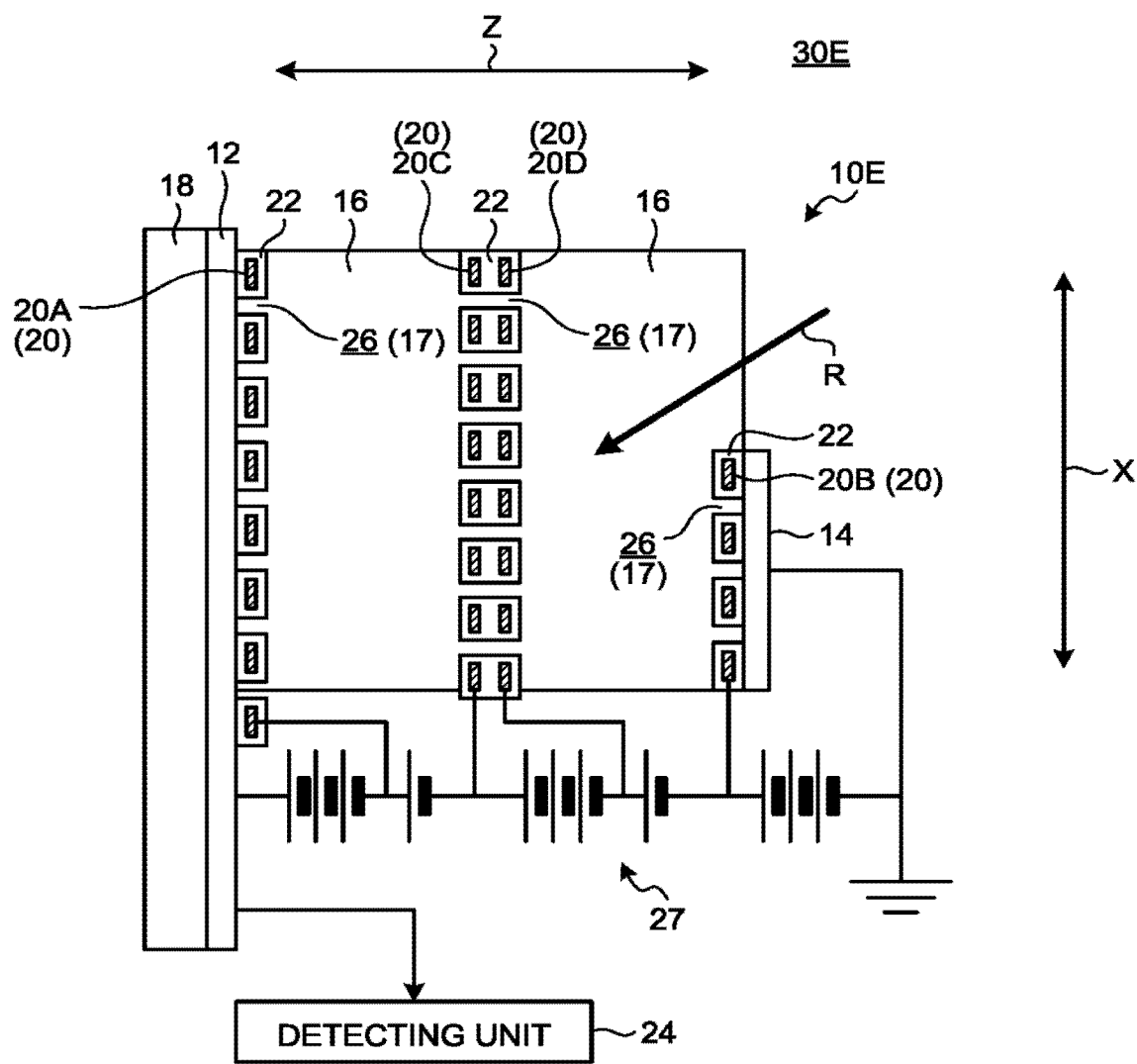

FIG. 6 is a schematic diagram illustrating an example of a detector 30E according to a second modification example.

The detector 30E includes a detecting element 10E, the detecting unit 24, and the voltage applying unit 27. Herein, the detecting element 10E, the voltage applying unit 27, and the detecting unit 24 are electrically connected to each other. Moreover, the voltage applying unit 27 and the detecting unit 24 are identical to the first embodiment.

The detecting element 10E includes the substrate 18; the first electrode 12; the second electrode 14; the organic conversion layer 16; and the third electrodes 20 that are at least partially covered by the insulating film 22. Herein, the substrate 18, the first electrode 12, the second electrode 14, the organic conversion layer 16, the third electrodes 20, and the insulating film 22 are identical to the first embodiment.

In the second modification example, in the detecting element 10E, the third electrodes 20 are disposed in between the first electrode 12 and the organic conversion layer 16, in between the organic conversion layer 16 and the second electrode 14, and in the organic conversion layer 16.

The third electrodes 20 that are disposed in between the first electrode 12 and the organic conversion layer 16 are referred to as the third electrodes 20A. Similarly, the third electrodes that are disposed in between the organic conversion layer 16 and the second electrode 14 are referred to as the third electrodes 20B. Moreover, the third electrodes 20 disposed in the organic conversion layer 16 are referred to as third electrodes 20C and third electrodes 20D. In an identical manner to the embodiments described earlier, the third electrodes 20 are covered by the insulating film 22. Moreover, in FIG. 6 is illustrated an example in which the third electrodes 20 (the third electrodes 20A, the third electrodes 20B, the third electrodes 20C, and the third electrodes 20D) have the through holes 26 formed therein.

In an identical manner to the embodiments and the first modification example described above, the voltage applying unit 27 can apply voltages in such a way that the first electrode 12 has a different electrical potential than the third electrodes 20 (the third electrodes 20A, the third electrodes 20B, the third electrodes 20C, and the third electrodes 20D). Moreover, the voltage applying unit 27 applies voltages in such a way that the third electrodes 20 have mutually different electrical potentials.

Meanwhile, of a plurality of third electrodes 20, at least two or more third electrodes 20 can be disposed in a single insulating film 22. In other words, a plurality of third electrodes 20 having mutually different position in the thickness direction Z of the organic conversion layer 16 can be disposed in a single insulating film 22.

In FIG. 6 is illustrated an example in which, from among the third electrodes 20A, the third electrodes 20B, the third electrodes 20C, and the third electrodes 20D; the third electrodes 20C and the third electrodes 20D are disposed in the same insulating film 22. Herein, the third electrodes 20C and the third electrodes 20D are sheet-like electrodes having mutually different positions in the thickness direction Z of the organic conversion layer 16.

Alternatively, the configuration can be such that, in between the first electrode 12 and the organic conversion layer 16, a plurality of third electrodes 20 having different positions in the thickness direction Z is disposed in a single insulating film 22. Still alternatively, the configuration can be such that, in between the second electrode 14 and the organic conversion layer 16, a plurality of third electrodes 20 having different positions in the thickness direction Z is disposed in a single insulating film 22.

In this way, when a plurality of third electrodes 20 having different positions in the thickness direction Z is disposed in a single insulating film 22, it becomes possible to apply a strong electrical field in a still smaller area while holding down injection of electrical charge from the third electrodes 20 to the organic conversion layer 16, thereby making it possible to hold down the effect of the positions of generation of the electron-hole pairs on the output signals.

Hence, in the detector 30E according to the second modification example, even if the radiation R having a weak energy level falls onto the organic conversion layer 16, it becomes possible to prevent any leakage in the counting of the small number of electron-hole pairs generated due to the weak radiation R. For that reason, in the detector 30E according to the second modification example, in addition to achieving the effects according to the embodiments described above, it becomes possible to enhance the sensitivity for detection of the detection R having a weaker energy level.

Third Modification Example

In FIG. 6 is illustrated the configuration in which a single insulating film 22, which includes a plurality of third electrodes 20 having different positions in the thickness direction Z, is disposed in the organic conversion layer 16. However, the detecting element 10E can be configured to have a plurality of insulating films 22, each including a plurality of third electrodes 20 having different positions in the thickness direction Z. In that case, the insulating films 22 can be disposed at mutually different positions in the thickness direction Z.

Figure 7:
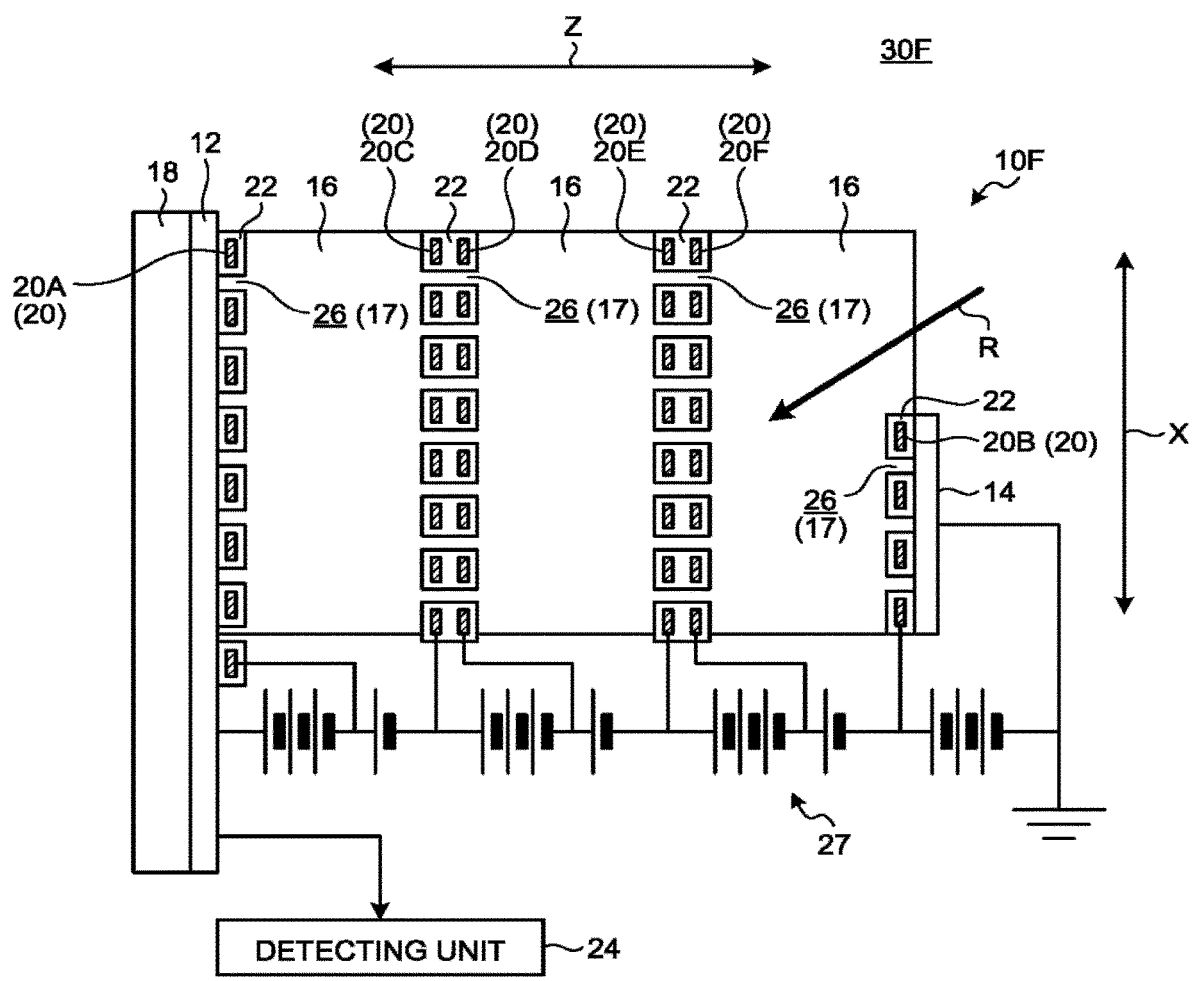

FIG. 7 is a schematic diagram illustrating an example of a detector 30F according to a third modification example.

The detector 30F includes a detecting element 10F, the detecting unit 24, and the voltage applying unit 27. Herein, the detecting element 10F, the voltage applying unit 27, and the detecting unit 24 are electrically connected to each other. Moreover, the voltage applying unit 27 and the detecting unit 24 are identical to the first embodiment.

The detecting element 10F includes the substrate 18; the first electrode 12; the second electrode 14; the organic conversion layer 16; and the third electrodes 20 that are at least partially covered by the insulating film 22. Herein, the substrate 18, the first electrode 12, the second electrode 14, the organic conversion layer 16, the third electrodes 20, and the insulating film 22 are identical to the first embodiment.

In the third modification example, in the detecting element 10F; the third electrodes 20C, the third electrodes 20D, third electrodes 20E, and third electrodes 20F are disposed in the organic conversion layer 16 of the detecting element 10D illustrated in FIG. 5. In FIG. 7 is illustrated an example in which, from among the third electrodes 20, the third electrodes 20C and the third electrodes 20D are disposed in a single insulating film 22, and the third electrodes 20E and the third electrodes 20F are disposed in another single insulating film 22.

Alternatively, a plurality of third electrodes 20 having different positions in the thickness direction Z can be disposed in between the first electrode 12 and the organic conversion layer 16, and can be disposed in a single insulating film 22. Still alternatively, a plurality of third electrodes 20 having different positions in the thickness direction Z can be disposed in between the second electrode 14 and the organic conversion layer 16, and can be disposed in a single insulating film 22. Still alternatively, three or more third electrodes 20 having different positions in the thickness direction Z can be disposed in a single insulating film 22.

In an identical manner to the embodiments and the modification examples described above, the voltage applying unit 27 can apply voltages in such a way that the first electrode 12 has a different electrical potential than the third electrodes 20 (the third electrodes 20A, the third electrodes 20B, the third electrodes 20C, the third electrodes 20D, the third electrodes 20E, and the third electrodes 20F). Moreover, the voltage applying unit 27 applies voltages in such a way that the third electrodes 20 have mutually different electrical potentials.

In this way, the detecting element 10F includes a plurality of insulating films 22, each including a plurality of third electrodes 20 having different positions in the thickness direction Z. As a result, it becomes possible to form a narrow area applied with a strong electrical field at a plurality of positions in the thickness direction Z, while holding down injection of electrical charge from the third electrodes 20 to the organic conversion layer 16.

For that reason, even if the radiation R having a still weaker energy level as compared to the second modification example falls onto the organic conversion layer 16, it becomes possible to prevent any leakage in the counting of the still smaller number of electron-hole pairs generated due to the weak radiation R. Moreover, even if the detecting element 10F includes the organic conversion layer 16 having a large thickness in the thickness direction Z, since a plurality of insulating films 22 each including a plurality of third electrodes 20 having different positions in the thickness direction Z is disposed in the detecting element 10F, it becomes possible to improve the amount of deposit of the radiation R having a high energy level as well as to detect the radiation R having a low energy level.

Meanwhile, there is no restriction on the scope of application of the detecting element 10, the detecting element 10A1, the detecting element 10A2, the detecting element 10B, the detecting element 10C, the detecting element 10D, the detecting element 10E, and the detecting element 10F described above in the embodiments. For example, the detecting element 10, the detecting element 10A1, the detecting element 10A2, the detecting element 10B, the detecting element 10C, the detecting element 10D, the detecting element 10E, and the detecting element 10F can be implemented in various devices that detect the radiation R. More particularly, the detecting element 10, the detecting element 10A1, the detecting element 10A2, the detecting element 10B, the detecting element 10C, the detecting element 10D, the detecting element 10E, and the detecting element 10F can be implemented in a survey meter.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A detecting element comprising:
   a first electrode to which a bias voltage is applied;
   a second electrode;
   an organic conversion layer that is disposed in between the first electrode and the second electrode, and that converts energy of radiation into electrical charge; and
   a third electrode that is disposed at least either in the organic conversion layer, or in between the organic conversion layer and the first electrode, or in between the organic conversion layer and the second electrode, and that is at least partially covered by an insulating film.

2. The detecting element according to claim 1, wherein, in the third electrode, at least either end face present on side of the first electrode or end face present on side of the second electrode in thickness direction of the organic conversion layer is covered by the insulating film.

3. The detecting element according to claim 1, wherein a first distance between the first electrode and the third electrode is different than a second distance between the second electrode and the third electrode.

4. The detecting element according to claim 3, wherein, in the third electrode, at least end face present on side of the electrode, of the first electrode and the second electrode, which is closer to the third electrode is covered by the insulating film.

5. The detecting element according to claim 1, wherein the third electrode is disposed inside the insulating film.

6. The detecting element according to claim 1, wherein, a plurality of third electrodes having mutually different positions in thickness direction of the organic conversion layer is disposed in the insulating film.

7. The detecting element according to claim 1, wherein, the third electrode includes at least one through hole that is formed in a penetrating manner in thickness direction of the organic conversion layer.

8. The detecting element according to claim 7, wherein, the third electrode includes a plurality of through holes, each having same size and being formed at equally spaced intervals along direction intersecting with the thickness direction.

9. The detecting element according to claim 7, wherein the at least one through hole is filled with constituent material of the organic conversion layer.

10. The detecting element according to claim 1, wherein, in the third electrode, a hole portion is formed that has opening either on side of the first electrode or on side of the second electrode.

11. The detecting element according to claim 10, wherein, in the third electrode, a plurality of the hole portion having same size is formed at equally spaced intervals along direction intersecting with thickness direction of the organic conversion layer.

12. The detecting element according to claim 10, wherein in the hole portion is filled with constituent material of the organic conversion layer.

13. The detecting element according to claim 1, wherein the third electrode is made of a conductive carbon material.

14. A detector comprising:
    the detecting element according to claim 1;
    a voltage applying unit that applies a bias voltage to the first electrode and the third electrode; and
    a detecting unit that detects an output signal which is output from the first electrode.

15. The detector according to claim 14, wherein the first electrode, the second electrode, and each of one or more of the third electrode have mutually different electrical potentials.

* * * * *